(12) United States Patent
Shinohara

(10) Patent No.: US 10,288,448 B2
(45) Date of Patent: May 14, 2019

(54) DISPLACEMENT SENSOR

(71) Applicant: AISIN SEIKI KABUSHIKI KAISHA, Kariya-shi (JP)

(72) Inventor: Minoru Shinohara, Koto-ku (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 70 days.

(21) Appl. No.: 15/705,944

(22) Filed: Sep. 15, 2017

(65) Prior Publication Data
US 2018/0080798 A1    Mar. 22, 2018

(30) Foreign Application Priority Data
Sep. 21, 2016  (JP) .................... 2016-184555

(51) Int. Cl.
| | |
|---|---|
| *G01D 5/14* | (2006.01) |
| *G01D 5/244* | (2006.01) |
| *G01R 33/00* | (2006.01) |
| *G01D 11/30* | (2006.01) |

(52) U.S. Cl.
CPC ......... *G01D 5/142* (2013.01); *G01D 5/24485* (2013.01); *G01D 11/30* (2013.01); *G01R 33/0005* (2013.01)

(58) Field of Classification Search
USPC ...................... 324/207.11–207.26
See application file for complete search history.

(56) References Cited

U.S. PATENT DOCUMENTS

2004/0021458 A1* 2/2004 Imamura ............... G01B 7/003
324/207.2

FOREIGN PATENT DOCUMENTS

| JP | 6-104380   | 4/1994 |
| JP | 8-213541   | 8/1996 |
| JP | 2000-156464 | 6/2000 |

* cited by examiner

*Primary Examiner* — Vincent Q Nguyen
(74) *Attorney, Agent, or Firm* — Oblon, McClelland, Maier & Neustadt, L.L.P.

(57) ABSTRACT

A displacement sensor includes first detection units that detect an amount of displacement of a same detection target, and are disposed such that detection surfaces for detecting the amount of displacement face each other; second detection units that detect an amount of displacement of the detection target which is the same as the detection target of the first detection units, and are disposed such that detection surfaces for detecting the amount of displacement face each other; and a lead frame including a main frame having one surface on which the first detection units are disposed and the other surface on which the second detection units are disposed, and a sub frame which is wire-bonded to electrodes provided on each detection surface of the first detection units and the pair of second detection units.

2 Claims, 1 Drawing Sheet

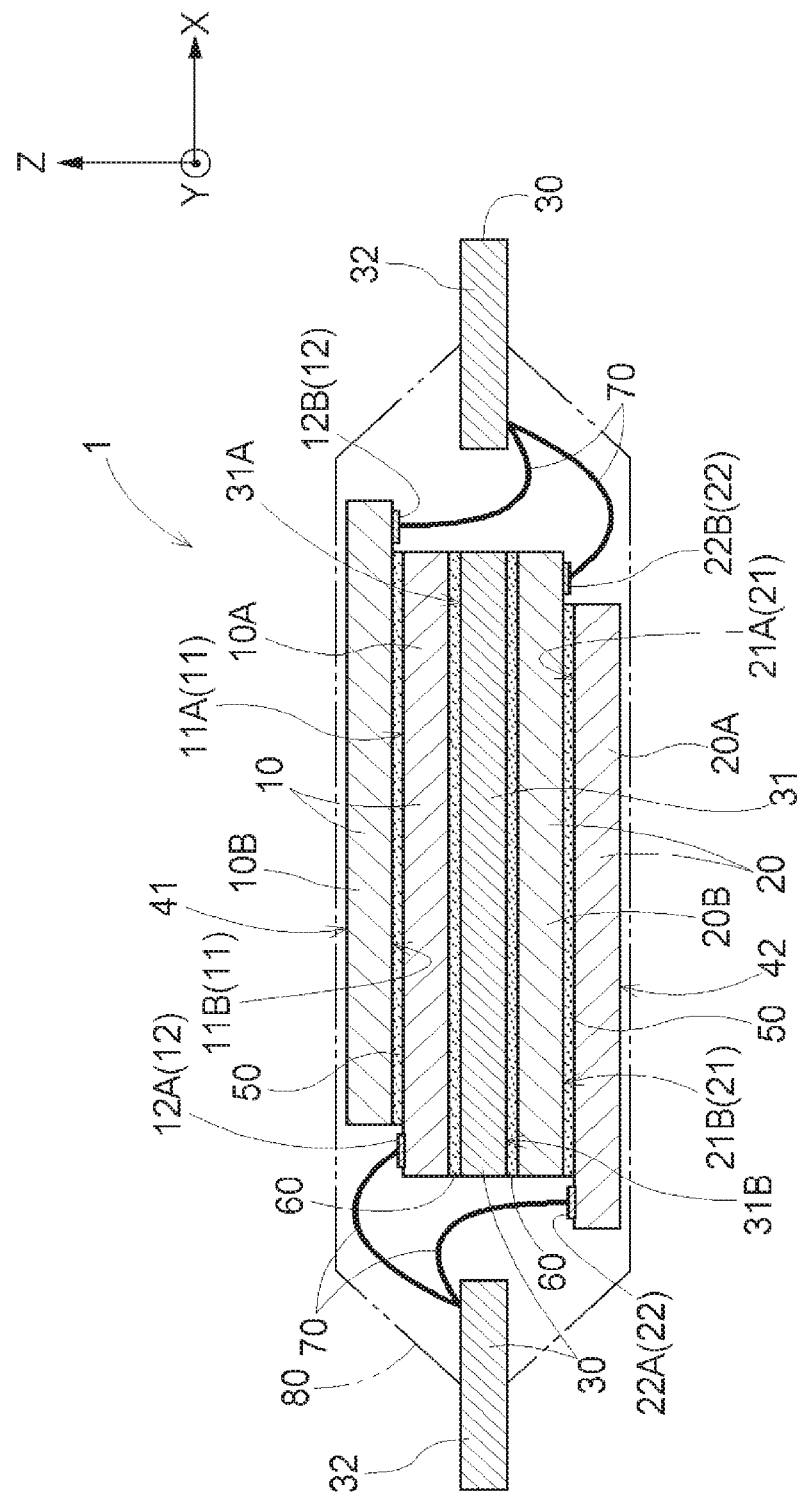

DISPLACEMENT SENSOR

CROSS REFERENCE TO RELATED APPLICATIONS

This application is based on and claims priority under 35 U.S.C. § 119 to Japanese Patent Application 2016-184555, filed on Sep. 21, 2016, the entire contents of which are incorporated herein by reference.

TECHNICAL FIELD

This disclosure relates to a displacement sensor that detects the amount of displacement of a detection target.

BACKGROUND DISCUSSION

In the related art, a displacement sensor that detects the amount of displacement is widely used. This type of displacement sensor may be configured by using, for example, semiconductor (for example, JP 6-104380A (Reference 1), JP 8-213541A (Reference 2), and JP 2000-156464 (Reference 3)).

A semiconductor integrated circuit device described in Reference 1 includes a first semiconductor chip provided on a lower surface of an inner lead through a first insulating layer, and a second semiconductor chip provided on an upper surface of the inner lead through a second insulating layer. Each of the first semiconductor chip and the second semiconductor chip is provided with a bonding pad on each of the surfaces facing the same direction, and is wire-bonded to predetermined portions on the upper surface of the inner lead.

In a semiconductor device described in Reference 2, bump electrodes having the same function as each other in a first semiconductor chip and a second semiconductor chip are disposed to face each other and are connected to the same lead.

In a semiconductor device manufactured by a method for manufacturing a semiconductor device described in Reference 3, a first semiconductor chip and a second semiconductor chip are directed to surfaces (back surfaces) opposite to respective circuit formation surfaces (front surfaces) and are bonded to be fixed in a stacked state in which positions are shifted in a direction orthogonal to a disposition direction of external electrodes provided on the circuit formation surfaces.

For example, a vehicle, an airplane or the like may be provided with a plurality of circuits (for example, a detection unit) having the same function from the viewpoint of safety. In a case where such use is taken into account, in the technique described in Reference 1, wire bonding is performed by using an upper surface of an inner lead, and thereby, it is necessary to shift a position of each chip, and there is a possibility that sensing accuracies of each of the circuits are significantly different from each other in use in which a positional relationship between a sensing point such as a magnetic sensor and a detection target is important. In addition, in the technique described in Reference 2, a first semiconductor chip and a second semiconductor chip need to be disposed to interpose an inner lead therebetween, and thereby, more chips cannot be stacked, and thicknesses of components increase by thicknesses of bump electrodes which connect the inner lead, the first semiconductor chip, and the second semiconductor chip to each other. In addition, in the technique described in Reference 3, wire bonding is performed by using surfaces of a first semiconductor chip and a second semiconductor chip, which do not face each other, and thereby, thicknesses thereof increase by a height of a wire.

Thus, a need exists for a displacement sensor which is not susceptible to the drawback mentioned above.

SUMMARY

A feature of a displacement sensor according to an aspect of this disclosure resides in that the displacement sensor includes a pair of first detection units that detect an amount of displacement of a same detection target, and are disposed such that detection surfaces for detecting the amount of displacement face each other; a pair of second detection units that detect an amount of displacement of the detection target which is the same as the detection target of the pair of first detection units, and are disposed such that detection surfaces for detecting the amount of displacement face each other; and a lead frame that includes a main frame having one surface on which the pair of first detection units are disposed and the other surface on which the pair of second detection units are disposed, and a sub frame which is wire-bonded to electrodes which are provided on each detection surface of the pair of first detection units and the pair of second detection units.

BRIEF DESCRIPTION OF THE DRAWING

The foregoing and additional features and characteristics of this disclosure will become more apparent from the following detailed description considered with the reference to the accompanying drawing, wherein:

the FIGURE is a side sectional view of a displacement sensor.

DETAILED DESCRIPTION

A displacement sensor described here is provided with a plurality of detection units having the same function and is configured such that a difference between detection results each of the detection units is small. Hereinafter, a displacement sensor 1 of the present embodiment will be described by using an example of a case where the displacement sensor is applied to a magnetic sensor that detects magnetic flux density.

The FIGURE is a side sectional view of the displacement sensor 1 of the present embodiment. As illustrated in the FIGURE, the displacement sensor 1 is configured to include first detection units 10, second detection units 20, and a lead frame 30.

The first detection units 10 are configured with a pair of first detection units 10A and 10B. The first detection units 10A and 10B detect the amount of displacement of the same detection target, and detection surfaces 11 for detecting the amount of displacement are disposed to face each other. In the present embodiment, "the detection units 10A and 10B detect the amount of displacement of the same detection target" means that both the first detection unit 10A and the first detection unit 10B detect the amount of rotation or a rotation angle (hereinafter, referred to as "the amount of rotation or the like") of a magnet attached to a rotation body as a detection target. The first detection units 10A and 10B can be configured by using, for example, Hall elements. "The detection surface 11 for detecting the amount of displacement" corresponds to a detection surface 11A in the first detection unit 10A and corresponds to a detection surface 11B in the first detection unit 10B. The detection surfaces 11A and 11B respectively correspond to detection surfaces of the Hall elements.

Therefore, the first detection unit 10A and the first detection unit 10B are disposed through an adhesive 50 such that the detection surface 11A of the first detection unit 10A and the detection surface 11B of the first detection unit 10B face each other. By disposing the first detection unit 10A and the first detection unit 10B in this manner, mutual detection points can be closer (that is, a distance in the Z-axis direction between the detection point of the first detection unit 10A and the detection point of the first detection unit 10B can be shortened), and thus, it is possible to reduce a difference between detection results of each of the first detection units 10A and 10B.

The second detection units 20 are configured with a pair of second detection units 20A and 20B. The second detection units 20A and 20B detect the amount of displacement of the same detection target as the detection target of the pair of the first detection units 10, and detection surfaces 21 for detecting the amount of displacement are disposed to face each other. As described above, the pair of the first detection units 10 detects the amount of rotation of a magnet and the like, in the present embodiment. Therefore, the second detection units 20A and 20B also detect the amount of rotation of a magnet and the like which are the same as those of the detection target of the first detection units 10. The second detection units 20A and 20B can also be configured by using, for example, Hall elements in the same manner as in the first detection units 10A and 10B. The detection surface 21 corresponds to a detection surface 21A in the second detection unit 20A, and corresponds to a detection surface 21B in the second detection unit 20B. The detection surfaces 21A and 21B respectively correspond to detection surfaces of the Hall elements.

Therefore, the second detection unit 20A and the second detection unit 20B are disposed through the adhesive 50 such that the detection surface 21A of the second detection unit 20A and the detection surface 21B of the second detection unit 20B face each other. By disposing the second detection unit 20A and the second detection unit 20B in this manner, mutual detection points can be closer (that is, a distance in the Z-axis direction between the detection point of the second detection unit 20A and the detection point of the second detection unit 20B can be shortened), and thus, it is possible to reduce a difference between detection results of each of the second detection units 20A and 20B.

The lead frame 30 is formed of a conductive material and includes a main frame 31 and a sub frame 32. The main frame 31 has one surface 31A on which the pair of the first detection units 10 are disposed and the other surface 31B on which the pair of the second detection units 20 are disposed. As described above, the pair of the first detection units 10 are disposed through the adhesive 50 such that the mutual detection surfaces 11 face each other, and the pair of the second detection units 20 are disposed through the adhesive 50 such that the mutual detection surfaces 21 face each other. The pair of the first detection units 10 configured as described above is bonded to the one surface 31A of the lead frame 30 through an adhesive 60, and the pair of the second detection units 20 configured as described above is bonded to the other surface 31B of the lead frame 30 through the adhesive 60.

In the present embodiment, the pair of the first detection units 10 and the pair of the second detection units 20 are disposed to face each other through the main frame 31. By disposing the pair of the first detection units 10 and the pair of the second detection units 20 in this manner, a distance in the X-axis direction between the detection point of the pair of the first detection units 10 and the detection points of the pair of the second detection units 20 can be reduced, and thus, It is possible to reduce the difference between the detection results of the pair of the first detection units 10 and the detection results of the pair of the second detection units 20. Particularly, in a case where the pair of the first detection units 10 and the pair of the second detection units 20 are viewed along a stacked direction of the pair of the first detection units 10 and the pair of the second detection units 20, the first detection unit 10A and the second detection unit 20B may overlap each other through the main frame 31. By doing so, a distance between the first detection unit 10A and the second detection unit 20B in the X-axis direction and the Y-axis direction can be zero, and a distance between the detection points of the pair of the first detection units 10 and the detection points of the pair of the second detection units 20 in the X-axis direction and the Y-axis direction can be shortened.

While not illustrated, it is preferable that disposition is made such that not only the distance in the X-axis direction between the detection points of the pair of the first detection units 10 and the detection points of the pair of the second detection units 20 is shortened, but also the distance in the Y-axis direction is shortened.

Electrodes 12 are provided on the detection surfaces 11 of the pair of the first detection units 10. Specifically, an electrode 12A is provided on the detection surface 11A of the first detection unit 10A, and an electrode 12B is provided on the detection surface 11B of the first detection unit 10B.

Electrodes 22 are provided on the detection surfaces 21 of the pair of the second detection units 20. Specifically, an electrode 22A is provided on the detection surface 21A of the second detection unit 20A, and an electrode 22B is provided on the detection surface 21B of the second detection unit 20B.

The sub frame 32 is wire-bonded to the electrodes 12 provided on the pair of the first detection units 10 and the electrodes 22 provided on the pair of the second detection units 20. At this time, as illustrated in the FIGURE, a wire 70 which is wire-bonded to the electrode 12A can be configured so as to be located on an inner side (the main frame 31 side) more than an outer end surface 41 of the first detection unit 10B, and a wire 70 which is wire-bonded to the electrode 22B can be configured so as to be located on an inner side (the main frame 31 side) more than an outer end surface 42 of the second detection unit 20A. Therefore, in this state, even in a case where the displacement sensor 1 is sealed in, for example, a resin 80, it is possible to configure such that a thickness (height in the Z-direction) of the resin 80 is not too large.

Another Embodiment

In the above embodiment, the displacement sensor 1 is described by using an example of a magnetic sensor, but the displacement sensor 1 can also be applied to other sensors.

In the above embodiment, the pair of the first detection units 10 and the pair of the second detection units 20 are described as being disposed to face each other through the main frame 31, but, the pair of the first detection units 10 and the pair of the second detection units 20 can also be disposed so as not to face each other through the main frame 31, that is, the pair of the first detection units 10 and the pair of the second detection units 20 can also be disposed so as to be locationally shifted in at least one direction of the X direction and the Y directions, in the FIGURE.

The present disclosure can be used for a displacement sensor that detects the amount of displacement of a detection target.

A feature of a displacement sensor according to an aspect of this disclosure resides in that the displacement sensor includes a pair of first detection units that detect an amount of displacement of a same detection target, and are disposed such that detection surfaces for detecting the amount of displacement face each other; a pair of second detection units that detect an amount of displacement of the detection target which is the same as the detection target of the pair of first detection units, and are disposed such that detection surfaces for detecting the amount of displacement face each other; and a lead frame that includes a main frame having one surface on which the pair of first detection units are disposed and the other surface on which the pair of second detection units are disposed, and a sub frame which is wire-bonded to electrodes which are provided on each detection surface of the pair of first detection units and the pair of second detection units.

According to this feature, detection surfaces of a pair of first detection units are disposed to face each other, and thereby, the pair of first detection units can be closer to each other in a stacked direction of the pair of first detection units. In the same manner, detection surfaces of a pair of second detection units face each other, and thereby, the pair of second detection units can be closer to each other in a stacked direction of the pair of second detection units. Furthermore, a main frame is disposed so as to be interposed between the pair of first detection units and the pair of second detection units, and thereby, the pair of first detection units and the pair of second detection units can be closer to each other. Therefore, it is possible to reduce a difference in sensing accuracies between the pair of first detection units and the pair of second detection units in a displacement sensor. In addition, each electrode of the pair of first detection units can be disposed so as to face a central side of the pair of first detection units in the stacked direction, and each electrode of the pair of second detection units can be disposed so as to face a central side of the pair of second detection units in the stacked direction, and thereby, it is possible to obtain a margin for a height by a thickness of at least one of the first detection units or the second detection units, when wire bonding is performed. Therefore, it is possible to prevent a height of the entire package from becoming too high when the displacement sensor is contained in the package.

It is preferable that the pair of first detection units and the pair of second detection units are disposed to face each other through the main frame.

According to this configuration, it is possible to prevent a location from being shifted in a surface direction (a direction orthogonal to a stacked direction) of the pair of first detection units and the pair of second detection units. Therefore, it is possible to reduce a difference between detection results of the pair of first detection units and detection results of the pair of second detection units.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A displacement sensor comprising:
   a pair of first detection units that detect an amount of displacement of a same detection target, and are disposed such that detection surfaces for detecting the amount of displacement face each other;
   a pair of second detection units that detect an amount of displacement of the detection target which is the same as the detection target of the pair of first detection units, and are disposed such that detection surfaces for detecting the amount of displacement face each other; and
   a lead frame that includes a main frame having one surface on which the pair of first detection units are disposed and the other surface on which the pair of second detection units are disposed, and a sub frame which is wire-bonded to electrodes which are provided on each detection surface of the pair of first detection units and the pair of second detection units.

2. The displacement sensor according to claim 1, wherein the pair of first detection units and the pair of second detection units are disposed to face each other through the main frame.

* * * * *